United States Patent [19]

Hock

[11] 4,238,695
[45] Dec. 9, 1980

[54] COMPARATOR CIRCUIT HAVING HIGH SPEED, HIGH CURRENT SWITCHING CAPABILITY

[75] Inventor: Richard H. Hock, Landing, N.J.

[73] Assignee: Bell Telephone Laboratories, Incorporated, Murray Hill, N.J.

[21] Appl. No.: 953,196

[22] Filed: Oct. 20, 1978

[51] Int. Cl.³ .......................................... H03K 5/153
[52] U.S. Cl. .................................... 307/350; 307/228; 307/265; 307/355; 307/362
[58] Field of Search .............. 307/300, 354, 356, 362, 307/228, 262, 265, 270, DIG. 3, 355; 330/257

[56] References Cited

U.S. PATENT DOCUMENTS

| | | | |
|---|---|---|---|
| 2,760,062 | 8/1956 | Hobbs | 328/93 |
| 3,094,632 | 6/1963 | Wartella | 307/216 |
| 3,210,570 | 10/1965 | Brock et al. | 307/242 X |
| 3,413,488 | 11/1968 | Yee | 307/216 |
| 3,838,262 | 9/1974 | Van de Plassche | 330/257 X |
| 4,017,743 | 4/1977 | Hartman | 307/237 |

Primary Examiner—John Zazworsky
Attorney, Agent, or Firm—Alfred G. Steinmetz

[57] ABSTRACT

A high current, high speed comparator switching circuit includes circuits to positively control turn on and turn off of switching transistors and counteract conduction overlap due to stored charge resulting from high current loads.

5 Claims, 3 Drawing Figures

4,238,695

COMPARATOR CIRCUIT HAVING HIGH SPEED, HIGH CURRENT SWITCHING CAPABILITY

TECHNICAL FIELD

This invention relates to comparator type switching circuits and, in particular, to high current, high speed switching circuits which may be embodied in integrated circuit form.

BACKGROUND OF THE INVENTION

Control circuits for power supplies are frequently embodied in integrated circuit form. Integrated circuits have an advantage of low cost when produced at high volume and, furthermore, have the advantage of high reliability as compared with circuits of similar type design utilizing discrete components. To achieve these benefits of integrated circuits design, an integrated control circuit must be versatile enough to permit wide application to varying sizes of power conditioning circuits.

Comparator type switching circuits are widely used in power supply control circuits. In switching regulator type power conditioning circuits, comparator type switching circuit is used to control the duty cycle of the switching device. It operates by comparing an error signal with a reference signal to determine the duty cycle of the switching device necessary to achieve a desired regulated output signal. Large current handling capacity and high switching speeds are desirable characteristics of an integrated comparator type switching circuit. These two desirable features, however, are antithetical operating characteristics. The handling of high currents in the output stages of the typical prior art comparator type switching circuit generates large storage charges in the semiconductor junctions which limit the switching speed.

SUMMARY OF THE INVENTION

Therefore, in accordance with the principles of the invention, a high switching speed is attained at a large current in a comparator switching circuit by employing combined active, simultaneous, positive turn on and turn off of the respective on-going and off-going switching transistors. A particular comparator circuit adapted to switch large currents at high speed comprises a first differential amplifier stage including first and second output signal switching stages, and a second differential amplifier stage having its inputs connected in common with the inputs to the first differential amplifier stage. First and second current mirror type current sinks are connected to be energized by first and second amplifying devices of the second differential amplifier stage and are further coupled to divert drive current from the first and second output signal switching stages when they are engergized by the first and second amplifying devices, respectively.

BRIEF DESCRIPTION OF THE DRAWING

Many objects, features, and advantages of this invention may be appreciated more readily from a reading of the following detailed description considered in connection with the accompanying figures wherein.

DETAILED DESCRIPTION

Figure 1:
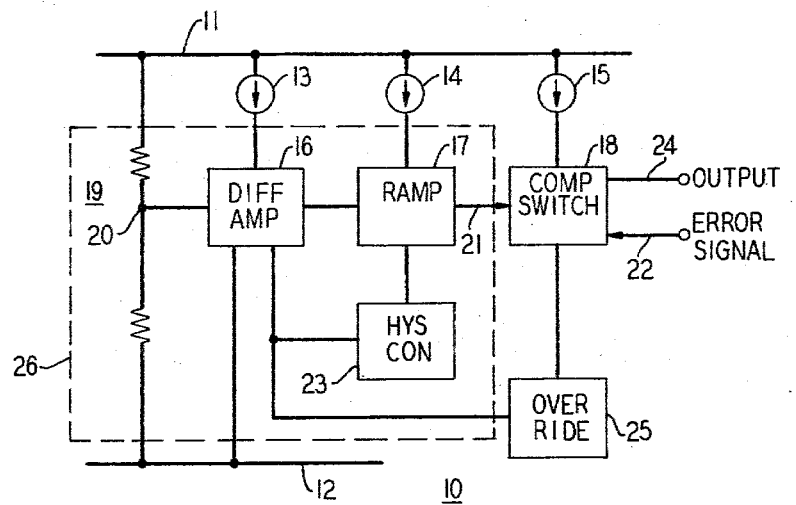
FIG. 1 is a block diagram of an integrated comparator type switching circuit embodying the principles of the invention.

An integrated comparator type switching circuit employing the principles of the invention is disclosed in block form in FIG. 1. This switching circuit 10 is designed to permit the rapid switching of relatively high current levels. Although not intended to limit the scope of the invention, switching speeds anticipated may go up to 100 kHz and current levels may exceed 200 milliamperes in the illustrative circuit. An energizing voltage is applied to a top common bus 11 of the switching circuit 10. Bottom bus 12 is a common ground. A plurality of constant current sources 13, 14, and 15 are connected to a differential amplifier 16, a ramp generator 17, and a comparator circuit 18, respectively. Ramp generator 17, differential amplifier 16 and associated circuitry function as a clock circuit 26 generating a periodic ramp signal which is applied to comparator circuit 18.

Voltage divider 19 of the clock circuit 26 is connected to the energizing bus 11 and to the common ground bus 12. A divided voltage is derived at node 20 and applied to an input of the differential amplifier 16. A second input to the differential amplifier is responsive to the ramp voltage signal of the ramp generator 17 which is the output stage of the clock 26. The signal voltage of the ramp generator is periodic and is applied to a first input 21 of the comparator circuit 18. An error signal which may be representative of the output signal of the power conditioner to be controlled is applied to another input 22 of the comparator circuit 18. Comparator 18 switches its state level in response to the relative magnitudes of the ramp signal voltage and the error signal level. Hence the output of the comparator 18 on lead 24 is a pulse whose duty cycle is responsive to the magnitude of the error signal on lead 22.

Ramp generator 17 is continuously charged by constant current source 14 and includes an internal charging capacitor. Differential amplifier 16 compares the voltage derived from the voltage divider with the voltage of the ramp generator 17 and operates to periodically discharge the internal charging capacitor in order to introduce periodicity into the ramp signal voltage.

A hysteresis control circuit 23 is coupled to respond to switching of the differential amplifier 16 and operates to introduce hysteresis into the switching operation to eliminate switching uncertainties as discussed herein below with reference to FIG. 2.

The generated ramp voltage is applied to an input 21 of the comparator circuit 18. The relative magnitudes of the ramp voltage and the error signal applied to input 22 of the comparator circuit 18 determines the width of a pulse generated at the output 24 of the comparator circuit 18. An override control 25 is connected to the comparator circuit and becomes operative when the error signal level drops below a predetermined minimum threshold level. It operates to limit the minimum duty cycle of the output pulse of the comparator circuit by latching the comparator into a predetermined state establishing a minimum pulse time interval.

Figure 2:
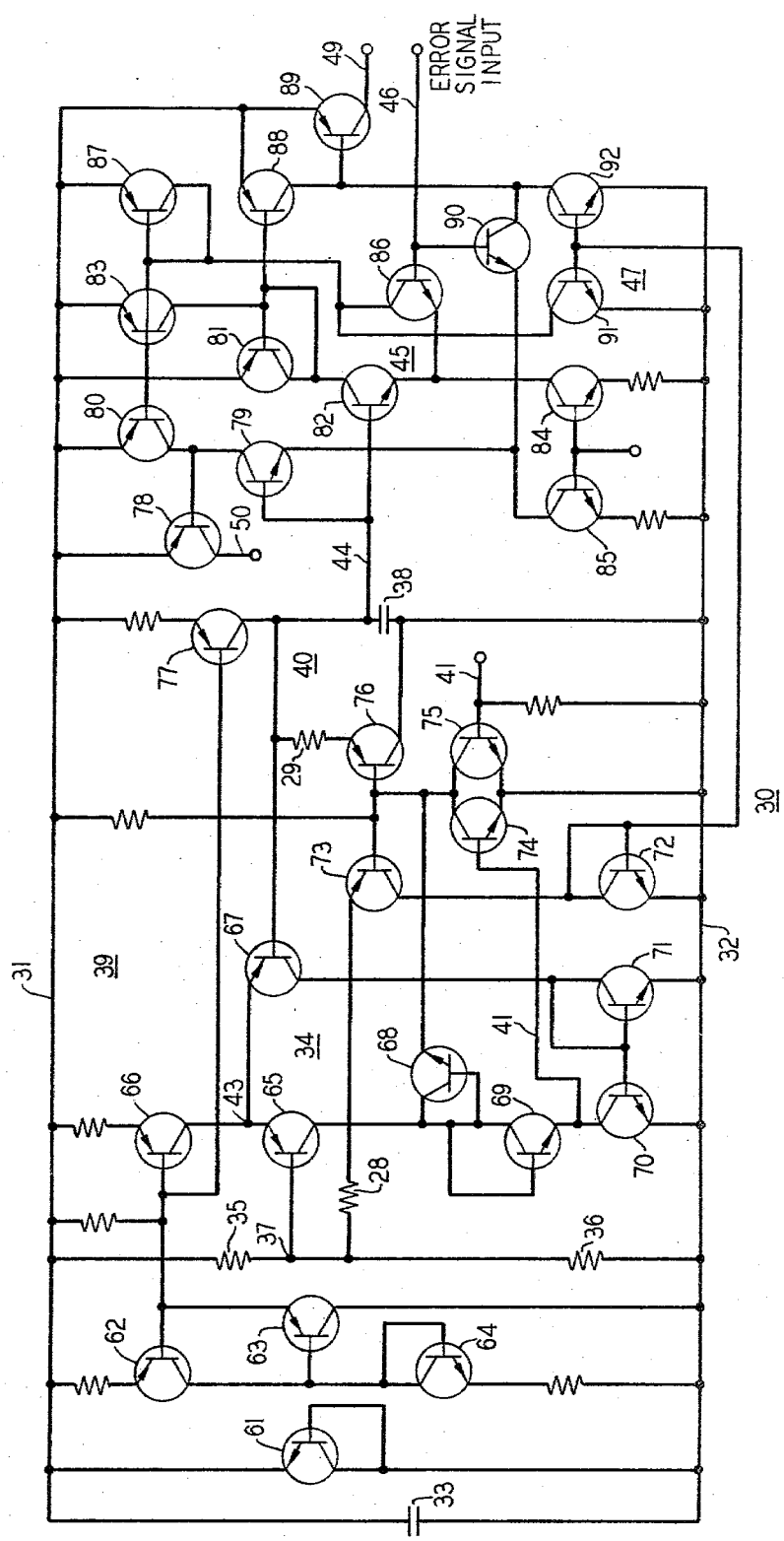
FIG. 2 is a schematic of the integrated comparator type switching circuit of FIG. 1 employing the principles of the invention which provides regulatory control for a switching regulator.

The various features of this integrated switching circuit are more readily apparent by examining the detailed schematic of FIG. 2. An integrated switching circuit 30 disclosed in FIG. 2 comprises a clock source including a differential amplifier, and a ramp generator; and a comparator circuit, as shown, may be embodied as an integrated circuit utilizing isolated junction technology.

An energizing voltage is applied to the top energizing bus 31 and the bottom common bus 32 is connected to ground. The energizing bus 31 and common bus 32 are shunted by a stabilizing capacitor 33 and also shunted by a transistor 61 with its base tied to its collector and having its polarity opposing the voltage of the energizing bus 31, in order to utilize its constant voltage breakdown characteristics.

The clock portion of the circuit includes a precision current source 39, a ramp signal generator 40, and a differential amplifier 34. The periodic ramp signal output of the clock assures the periodic operation of the comparator circuit 45 described herein below.

Transistors 62, 63, 66, and 77 energized by the energizing bus 31 are connected to form a precision current source 39 which is utilized to apply a precision current to a differential amplifier stage 34 comprising transistors 65 and 67 and to the ramp charging capacitor 38. The operation of such precision current sources is well known in the art, and it is not believed necessary to describe its operation in detail.

A voltage divider comprising two resistors 35 and 36 shunts the energizing bus 31 and common bus 32. Midpoint node 37 joining these two resistors is coupled to the base electrode of transistor 65 of the differential amplifier stage 34. Differential amplifier 34 comprising transistors 65 and 67 is a very high gain differential amplifier operating in a bistable mode which operates in the same way that the well-known differential amplifier comprising discrete components operates. A constant current is applied to the transistors 65 and 67 via the current source transistor 66. The collectors of transistors 65 and 67 are coupled to the common ground bus through a current mirror type current sink comprising transistors 70 and 71 whose conductivity is enabled by the collector current output of transistor 67. Transistors 70 and 71 are nonconducting when transistor 65 is conducting and ensure that the collector current output of the transistor 65 is applied to enable a ramp capacitor discharge path transistor 76 to conduct.

As indicated, a first input signal voltage is applied to the base of transistor 65 through node 37 of the voltage divider. A second input signal voltage generated by a ramp charging capacitor 38 is applied to the base electrode of the transistor 67. The ramp charging capacitor is linearly charged from a current source transistor 77 which is coupled as part of the above-described current source comprising transistors 62 and 66. The relative magnitude of the signal voltage applied to the base electrodes of transistors 65 and 67 determines which transistor conducts. This conduction is arranged so that the ramp charging capacitor 38 is periodically discharged thereby generating a periodic ramp signal.

The ramp charging capacitor 38 is periodically discharged through a path provided by the transistor 76 whose conductivity is controlled by an output of the differential amplifier stage 34. The output signal in this differential amplifier to control the discharge of capacitor 38 is the collector current of transistor 65 which is coupled via a diode connected transistor 69 to the base of the transistor 74 which in turn biases transistor 73 and transistor 76 conducting. Transistor 76 shunts the ramp charging capacitor 38 and provides a discharge path thereto. With transistor 73 in a conducting condition, the resistor 28 is connected in parallel with resistor 36. This lowers the voltage level at node 37. Capacitor 38 discharges until its voltage equals the lowered voltage at node 37.

At this voltage point, the differential amplifier 34 changes state; transistor 67 is now conducting and transistor 65 is nonconducting. The current mirror pair comprising transistors 70 and 71 is biased into conduction thereby turning off transistor 74 and, in turn, transistors 73 and 76 thereby permitting the cycle of operation to repeat.

The conductivity of either transistor 65 or 67 is controlled by the relative voltage magnitudes applied to their respective base electrodes. Under certain operating conditions at start-up the minimum discharge voltage of capacitor 38 could exceed the divided voltage at node 37 causing the differential amplifier 34 to latch in one state (i.e., output of transistor 65 low).

A hysteresis control is included to prevent this latchup of the differential amplifier 34. This control includes resistor 28 and transistor 73 which is switched in synchronism with the discharge transistor 76 and is connected through transistor 72 to ground. The hysteresis control operates to controllably increase the voltage at node 37 above the voltage of the ramp charging capacitor 38 and hence prevents a latching condition from occurring.

The differential amplifier stage 34 is operative as a bistable comparator responding to the relative magnitudes of the divided voltage at node 37 and the voltage of the ramp charging capacitor 38. Since the ramp charging capacitor 38 is periodically discharged, the output of the differential amplifier stage 34 to the comparator 45 is a periodic ramp signal.

The ramp voltage appearing across the ramp capacitor 38 is coupled to an input lead 44 of the comparator 45. Comparator circuit 45 continually compares the magnitude of the voltage of the ramp charging capacitor 38 with an error signal voltage applied to error signal input lead 46. The output of the comparator on lead 49 is a width modulated pulse which may be used to drive a switching device in a switching type voltage converter.

The comparator circuit 45 comprises two differentially coupled transistor parts. Transistors 79 and 90 provide output drive and transistors 82 and 86 provide active turnoff for these parts, respectively. These differentially coupled transistor pairs act in concert to provide rapid switching of high level currents. Collector current is provided by current mirror connected current sources energized by the energizing voltage bus 31.

The error signal, with which the ramp voltage is compared, is applied to the error signal input lead 46 which is coupled to the base electrodes of transistors 86 and 90. The ramp voltage is coupled to the base electrodes of transistors 79 and 82. The current supplied to the collector of transistor 86 is supplied by a current mirror current source comprising transistors 80, 83, and 87 coupled to the energizing bus. A current to the collector of transistor 79 is supplied via the base electrode of transistor 79. Current to the collector of transistor 82 is supplied by the current mirror current source comprising transistors 81 and 88. A current to the collector of transistor 90 is supplied via the base electrode of transistor 89. Transistor 83 is included in one of the current mirror current sources to rapidly disable the other current mirror current source in order to assist in the high speed termination of the output pulse on output lead 49.

An override clamping circuit 47 comprising transistors 91 and 92 is connected to the collectors of transistors 86 and 90, respectively. The purpose of this clamping circuit 47 is to limit the minimum duration of a pulse output on lead 49 regardless of the relative signal inputs to the comparator. This guarantees the generation of a minimum duty pulse during each cycle of operation. The clamping circuit 47 is activated by the conduction of transistor 73 which is responsive to the discharge of the ramp charging capacitor 38. Since the ramp discharge occurs once each cycle, the output of the clamping circuit 47 to limit the duty cycle of the signal at output lead 49 is periodic. An energizing voltage is applied to the common base of transistors 84 and 85 to act as a current source and permit energization of the comparator circuit.

The principles of the invention may best be understood by a detailed description of the operation of the switching circuit shown in the schematic of FIG. 2. A stabilized energizing voltage is applied to the energizing bus lead 31. A filter capacitor 33 and a transistor 61 connected as a zener diode connect the energizing bus 31 to the common bus lead 32. A current source comprising transistors 62, 63, 66, and 77 supply a constant current to the common emitter node 43 of the differential amplifier stage 34 and to a ramp charging capacitor 38. The base electrode of transistor 65 of the differential amplifier 34 is connected to node 37 of a voltage divider comprising the two resistors 35 and 36. The other input of this differential amplifier 34, the base electrode of transistor 67, is coupled to the voltage on the ramp charging capacitor 38, which is continuously charged by a current flowing through the current source transistor 77.

The constant current of transistor 66 is coupled to the common emitter node 43 of the differential amplifier pair transistors 65 and 67. Differential amplifier 34 operates in the same manner as a heavily biased discrete component differential type amplifier wherein a differential mode signal applied to the base electrode of transistors 65 and 67 unbalances the circuit and changes the conduction and nonconduction states of the two transistors. It hence produces a signal state difference between the two output collector terminals. This highly biased differential amplifier 34 is operated in a bistable mode, namely, either transistors 65 or 67 is conducting but not both transistors. The collectors are connected to a common mode current sink comprising transistors 70 and 71. The collector current output of the transistor 65 is coupled to control the conductivity of transistor 76, which controls the discharge of the ramp charging capacitor.

Figure 3:
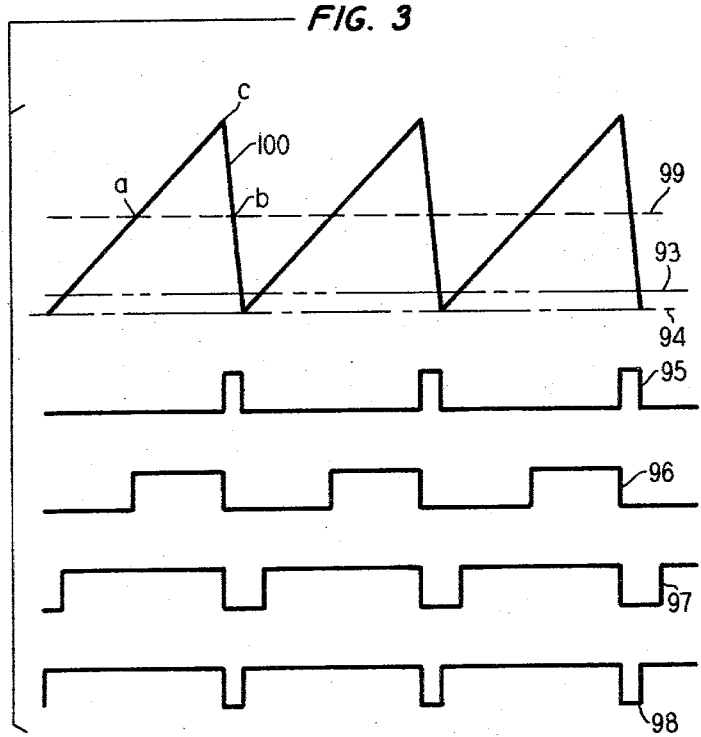
FIG. 3 discloses voltage waveforms to assist in explaining the operation of the comparator type switching circuit disclosed in FIG. 2.

The voltage on the ramp charging capacitor is shown by the waveform 100 in FIG. 3. Waveforms 99, 93, and 94 represent various levels of the error signal applied to lead 46 of the comparator. The waveforms 96, 97, and 98 are the width modulated pulse output on lead 49 corresponding to the error signal levels 99, 93, and 94, respectively. Waveform 95 is an override pulse signal which limits the minimum duty cycle of the pulse output on lead 49 at low error signal levels such as the error signal level 94.

For purposes of explanation of the operation of the switching type comparator circuit, assume that the ramp capacitor 38 has just begun charging. At this particular moment the voltage applied to the base of transistor 67 is lower than the voltage applied to the base of transistor 65 by the voltage divider at node 37. The ramp charging capacitor 38 is charged by current through transistor 77 and the voltage which is applied to the base of transistor 67 increases. The ramp voltage as shown by waveform 100 is also applied to the input lead 44 of the comparator 45, and, by being compared with the error signal applied to lead 46, determines the duty cycle of a pulse output on lead 49.

When the voltage applied to the base of transistor 67 exceeds the voltage applied to the base of transistor 65, the conductivity roles of transistors 65 and 67 change, and transistor 65 now conducts. The collector current of transistor 65 is applied via the diode connected transistor 69 to the base of transistor 74 biasing it into conduction. Conduction of transistor 74 causes transistor 76 to conduct. Transistor 76 and the resistor 29 now provide a discharge path for the stored charge on the ramp charging capacitor 38.

The conduction of transistor 74 also causes transistor 73 to conduct. Transistor 73 is coupled to the base of transistor 65 by resistor 28 and conduction therethrough operates to introduce hysteresis into the operation of the differential amplifier 34. It has been found that the discharged voltage of the ramp charging capacitor 38 may be greater under certain start-up conditions than the voltage at node 37 applied to the base of transistor 65 by the voltage divider comprising the resistors. This causes the circuit to latch into one state.

Under these conditions the base-emitter junction voltage drops of transistors 74 and 76 prevent charging capacitor 38 from discharging lower than the voltage at node 37.

The presence of the base-emitter junction of transistor 73 in conjunction with resistors 28, 35, and 36 guarantee that the voltage applied at node 37 will always be greater than the lowest possible voltage to which capacitor 38 may discharge. This assures that the differential amplifier will not latch into a fixed state. The continued periodic switching of the differential amplifier 34 assures the generation of a periodic ramp pulse at lead 44.

The periodic switching of the differential amplifier 34 may be overridden by an external periodic signal source coupled to lead 41. This external synchronizing signal is applied to the base of transistor 75 whose collector output is coupled in turn to the base of transistor 76 to effect the discharging of the ramp charging capacitor 38.

The ramp voltage of the ramp charging capacitor 38 is applied to an input lead 44 of the comparator circuit 45 where it is compared with the error signal input applied to input lead 46 of the comparator circuit. The comparator circuit responds to the respective magnitude of the ramp voltage and the error signal to provide pulse width modulated complementary output drive signals at the output leads 49 and 50. To understand the operation of the comparator circuit 45, assume initially that the ramp voltage magnitude at lead 44 exceeds the error signal voltage magnitude at lead 46. A typical error signal voltage magnitude is shown by the dotted line waveform 99 and a ramp voltage is shown by waveform 100 in FIG. 3. At point a where the ramp voltage magnitude just exceeds the error magnitude transistors 79 and 82 are biased into their conducting condition. At this moment, point a, transistors 86 and 90 are biased nonconducting. As described hereinabove the differentially paired transistors 82 and 86 and 79 and 90 have their inputs connected in parallel, and the parallel transistors 82 and 86 and 79 and 90 operate as active turnoff controls and output drive controls, respectively. The parallel input connections are to permit the application of base drive to two separate differential amplifier connections to provide active and simultaneous output drive and turn-off signals. These signals are simultaneously applied to different differentially coupled portions of the comparator 45. This signal application is simultaneous and not sequential.

In response to conduction in transistor 82, the diode connected transistor 81 is biased conducting. In turn, the transistor 88, which is connected in a current mirror arrangement with the transistor 81, is also biased conducting. This actively turns off the transistor 89 which had been conducting and achieves very rapid turn off since base drive is actively diverted from the base of transistor 89. Transistor 79 in its conducting mode supplies a base drive current for the output transistor 78 which is biased into conduction. The oppositely phased output transistor 89 is in a nonconducting state.

As can be seen from the waveforms 100 and 99, the point a at which the ramp voltage just exceeds the error signal 99 initiates the pulse output 96. Several possible error signal levels are shown. Waveform 99 is a typical error signal level while waveform 93 is a low magnitude error signal at which the comparator still responds normally. Error signal level 94 is abnormally low; hence, a minimum duty cycle control takes charge as described hereinbelow.

As is apparent from the waveform 100, the ramp voltage increases to a maximum point c where the ramp charging capacitor 38 is discharged by the switching of the differential amplifier 34. This voltage begins to decay and at point b the pulse output of the comparator is terminated.

When the ramp voltage decreases just below the error signal voltage magnitude, as shown by point b in FIG. 3, the transistors 79 and 82 are biased nonconducting while transistors 86 and 90 are biased conducting. The now conducting transistor 86 biases the transistor 87 into conduction. Transistor 87 is diode connected and is associated in a current mirror arrangement with transistor 80 and transistor 83. With transistor 87 conducting, transistor 80 is conducting and the conductance of transistor 80 shorts the base emitter of the transistor 78 and quickly turns it off. Transistor 83 is turned on and actively operates to turn off the transistors 81 and 88 so that the transistor 89 can turn on quickly. The transistor 90 is now conducting the necessary base drive to bias the output transistor 89 conducting.

The switching circuit includes protective features described hereinbelow to assure a minimum duty cycle if the error signal voltage drops to a very low threshold such as is shown by the lower error signal waveform 94. Hence an override signal is provided to assure a minimum duty cycle and provide a periodic pulse output from the transistor 89 regardless of a low error signal magnitude and similarly, during this time period, inhibit the operation or conduction of transistor 78. This input signal is periodically supplied via a diode connected transistor 72 to the common base electrode of transistors 91 and 92. In response to the signal of transistor 91, transistors 87, 83, and 80 are biased conducting. Transistors 81, 78, and 88 in consequence are biased off. Transistor 89 is biased conducting in response to the signal of transistor 92 for a short minimum duty cycle.

It is apparent from the foregoing that the comparator circuit is constructed to actively turn off transistors when their oppositely phased transistors are turned on to nullify the effects of stored charge and permit the rapid switching of large currents.

I claim:

1. A switching circuit adapted to switch large currents at high speed comprising
   a first differentially coupled amplifier stage including a first and second input, and further including first and second output signal switching stages,
   a second differentially coupled amplifier stage having first and second inputs connected in common with the first and second inputs to the first differentially coupled amplifier stage,
   a first current mirror type current sink connected to be energized by a first amplifying device of said second differentially coupled amplifier stage and coupled to divert drive current from the second output signal switching stage when energized by said first amplifying device,
   a second current mirror type current sink connected to be energized by the second amplifying device of said second differentially coupled amplifier stage and coupled to divert drive current from the first output signal switching stage when energized by said second amplifying device,
   a clock circuit including a ramp charging device for applying periodic ramp signals to the first input of said first differentially coupled amplifier stage,
   pulse generating means responsive to a discharge of said ramp charging device, and
   means responsive to the pulse generating means to clamp said first differentially coupled amplifier stage into a predetermined state for extablishing at least a minimum time duration of a predetermined switched state of the switching circuit irrespective of an error signal magnitude applied to the second input of said first differentially coupled amplifier stage.

2. A switching circuit as defined in claim 1 wherein said means for establishing at least a minimum time duration is responsive to the operation of said third differential amplifier stage.

3. A switching circuit as defined in claim 1 wherein said clock circuit includes the ramp charging device charged by a constant current source and a third differential amplifier stage adapted to periodically discharge said ramp charging device, said third differential amplifier stage including 4. A signal differential responsive high speed current switching circuit comprising
   a first pair of signal differential responsive switching transistors with inputs,
   a second pair of signal differential responsive switching transistors with inputs,
   the inputs to said first pair and second pair of signal differential responsive switching transistors being coupled in common,
   first current mirror circuit to couple a first transistor of said first pair with a second transistor of said second pair and control respective current flow therein,
   a second current mirror circuit to couple a second transistor of said first pair with a first transistor of said second pair and control respective current flow therein, first and second output transistors coupled to be enabled by said second pair of signal differential responsive switching transistors, said first pair of signal differential responsive switching transistors coupled to said first and second current mirror circuits to disable said first output transistor when said second output transistor is enabled and to disable said second output transistor when said first output transistor is enabled.

5. A signal differential responsive high speed switching circuit as defined in claim 4 further including
control means to enable the first output transistor and disable the second output transistor irresponsive of the input signals to said first pair of signal differential responsive switching transistors, said second mirror circuit being coupled to divert base drive from said second output transistor.

* * * * *

UNITED STATES PATENT AND TRADEMARK OFFICE
CERTIFICATE OF CORRECTION

PATENT NO. : 4,238,695
DATED : December 9, 1980
INVENTOR(S) : Richard H. Hock

It is certified that error appears in the above—identified patent and that said Letters Patent is hereby corrected as shown below:

Column 4, line 47, "parts" should read --pairs--; line 49, "parts" should read --pairs--; line 63, "79" should read --78--. Column 8, line 36, "extablishing" should read --establishing--; line 51, after "including", --feedback means to prevent circuit latchup.-- should be inserted.

Signed and Sealed this

Tenth Day of March 1981

[SEAL]

*Attest:*

RENE D. TEGTMEYER

*Attesting Officer*   *Acting Commissioner of Patents and Trademarks*